United States Patent [19]
Mandai et al.

[11] Patent Number: 5,726,612
[45] Date of Patent: Mar. 10, 1998

[54] CHIP-TYPE ELECTRONIC COMPONENT

[75] Inventors: Harufumi Mandai; Noboru Kato; Koji Shiroki; Atsushi Tojyo, all of Nagaokakyo, Japan

[73] Assignee: Murata Manufacturing Co., Ltd., Japan

[21] Appl. No.: 693,582

[22] Filed: Aug. 1, 1996

Related U.S. Application Data

[63] Continuation of Ser. No. 393,253, Feb. 23, 1995, abandoned, which is a continuation of Ser. No. 160,932, Dec. 1, 1993, abandoned.

[30] Foreign Application Priority Data

Dec. 1, 1992 [JP] Japan ..................... 4-321886
Dec. 8, 1992 [JP] Japan ..................... 4-328208

[51] Int. Cl.⁶ ..................................... H03H 7/01
[52] U.S. Cl. .................. 333/184; 333/185; 361/763; 361/321.2; 29/740; 29/743; 336/65
[58] Field of Search ............................ 333/172, 184, 333/185, 247; 361/761, 763, 764–766, 820, 321.2; 29/740–743; 336/65

[56] References Cited

U.S. PATENT DOCUMENTS

| | | | |
|---|---|---|---|
| 3,648,132 | 3/1972 | Rayborn | 361/321.2 X |
| 4,439,814 | 3/1984 | Rhodes | 361/321.5 |
| 4,516,092 | 5/1985 | Rosenberg | 333/184 |
| 4,758,808 | 7/1988 | Sasaki et al. | 333/185 |
| 4,777,461 | 10/1988 | Sakamoto | 336/192 X |
| 4,810,983 | 3/1989 | Okubo | 333/185 X |
| 4,864,471 | 9/1989 | Hargasser et al. | 361/765 X |
| 5,083,237 | 1/1992 | Tsuji | 361/765 |
| 5,182,536 | 1/1993 | Boylan et al. | 336/65 |
| 5,225,969 | 7/1993 | Takaya et al. | 333/185 X |
| 5,231,753 | 8/1993 | Tanaka et al. | 29/743 X |
| 5,341,563 | 8/1994 | Kamakura et al. | 29/743 |

FOREIGN PATENT DOCUMENTS

| | | | |
|---|---|---|---|
| 3536908 | 4/1988 | Germany . | |
| 4008507 | 9/1990 | Germany . | |
| 9110829 | 2/1992 | Germany . | |
| 4101790 | 7/1992 | Germany . | |
| 61-105809 | 5/1986 | Japan . | |
| 61-105810 | 5/1986 | Japan . | |
| 61-105811 | 5/1986 | Japan . | |
| 61-105812 | 5/1986 | Japan . | |
| 61-97807 | 5/1986 | Japan . | |
| 61-97808 | 5/1986 | Japan . | |
| 61-97809 | 5/1986 | Japan . | |
| 61-124118 | 11/1986 | Japan . | |
| 61-124119 | 11/1986 | Japan . | |
| 0233818 | 9/1989 | Japan | 333/185 |
| 2250409 | 10/1990 | Japan . | |

OTHER PUBLICATIONS

German Office Action dated 14 Feb. 1995 and English-language translation.

*Primary Examiner*—Robert Pascal
*Assistant Examiner*—Justin P. Bettendorf
*Attorney, Agent, or Firm*—Ostrolenk, Faber, Gerb & Soffen, LLP

[57] ABSTRACT

A chip-type electronic component comprising at least one electronic component element which is mounted on a substrate. The electronic component element is provided on its upper portion with a flat surface which can be engaged by a suction nozzle.

2 Claims, 6 Drawing Sheets

CHIP-TYPE ELECTRONIC COMPONENT

This is a continuation of application Ser. No. 08/393,253, filed on Feb. 23, 1995, now abandoned, which is a continuation of application Ser. No. 08/160,932, filed on Dec. 1, 1993, now abandoned.

BACKGROUND OF THE INVENTION

1. Field of the Invention

The present invention relates to a surface-mounted chip-type electronic component (SMD).

2. Description of the Background Art

In general, a chip-type electronic component comprising an electronic component element which is mounted on a ceramic substrate is covered with a can case by casing or coated with resin by molding, to serve as a surface-mounted device (SMD).

Such a cased or molded chip-type electronic component can be integrally handled as a whole, so that an upper portion of this chip-type electronic component can be engaged by a suction nozzle, to be surface-mounted.

However, the chip-type electronic component is disadvantageously increased in size by such casing or molding, and a large space is required for carrying the same. When a conventional chip-type electronic component is employed, therefore, it is impossible to surface-mount the same in high density.

SUMMARY OF THE INVENTION

An object of the present invention is to provide a chip-type electronic component which can be miniaturized with no requirement for casing or molding.

The chip-type electronic component according to the present invention comprises at least one electronic component element which is mounted on a substrate. This electronic component element is provided on its upper portion with a flat surface which can be engaged by a suction nozzle.

According to the present invention, the electronic component element which is mounted on the substrate is not particularly restricted but must be provided on its upper portion with a flat surface which can be engaged by a suction nozzle. Such an electronic component element can be formed by an inductance chip or an inductance block having a magnetic body, for example. Alternatively, the electronic component element may be formed by a capacitor chip or an IC chip, for example.

According to the present invention, the flat surface provided on the upper portion of the electronic component element which is mounted on the substrate must at least have an area allowing engagement by a suction nozzle for holding the chip-type electronic component in surface mounting. Further, the electronic component element is preferably mounted on the substrate to be located substantially at its center, so that the electronic component element is held in a more stable state. The electronic component element may not necessarily be located at the center the substrate, so far as the overall chip-type electronic component can be stably held by the suction nozzle engaging the electronic component element.

When the substrate is formed by a dielectric substrate, the chip-type electronic component can be provided with a capacitor in this substrate. Further, the substrate can be provided on its surface with electrodes for connecting the electronic component element. The electronic component element can be mounted on the substrate through soldering to the electrodes which are provided on its surface. In order to reinforce such fixing by soldering, thermosetting resin may be provided between the electronic component element and the substrate to serve as an adhesive, thereby improving bond strength between the substrate and the electronic component element.

When the substrate is formed by a dielectric substrate, further, it is possible to provide a plurality of internal electrodes in the interior of this dielectric substrate to overlap with each other through a dielectric layer, thereby forming a capacitor part. When an inductance component is mounted on such a dielectric substrate, it is possible to prepare an LC filter from the chip-type electronic component by electrically connecting this inductance component with the capacitor part provided in the dielectric substrate. Since the dielectric substrate is provided with at least one capacitor part in its interior, no separate capacitor part is required and a space for such a capacitor can be reduced. Further, it is possible to adjust the characteristics by trimming the capacitor part which is formed in the dielectric substrate with a laser beam or the like, whereby fine adjustment of the characteristics can be facilitated and the characteristics are improved in stability after the adjustment.

According to the present invention, the chip-type electronic component can be engaged by a suction nozzle to be subjected to surface mounting, with no requirement for casing or molding. Thus, the overall chip-type electronic component can be miniaturized as compared with the prior art, thereby enabling surface mounting of high density. For example, the inventive chip-type electronic component can be miniaturized to 4.5 by 3.2 mm as compared with a conventional component of about 5.3 by 4 mm. In other words, the present, invention enables miniaturization of the chip-type electronic component by 5 to 30%.

Further, the inventive chip-type electronic component can be manufactured through simpler steps as compared with the prior art, with no requirement for the operation such as casing or molding. In addition, the inventive chip-type electronic component can be manufactured at a lower cost as compared with the prior art since neither a casing component nor a molding material is required.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
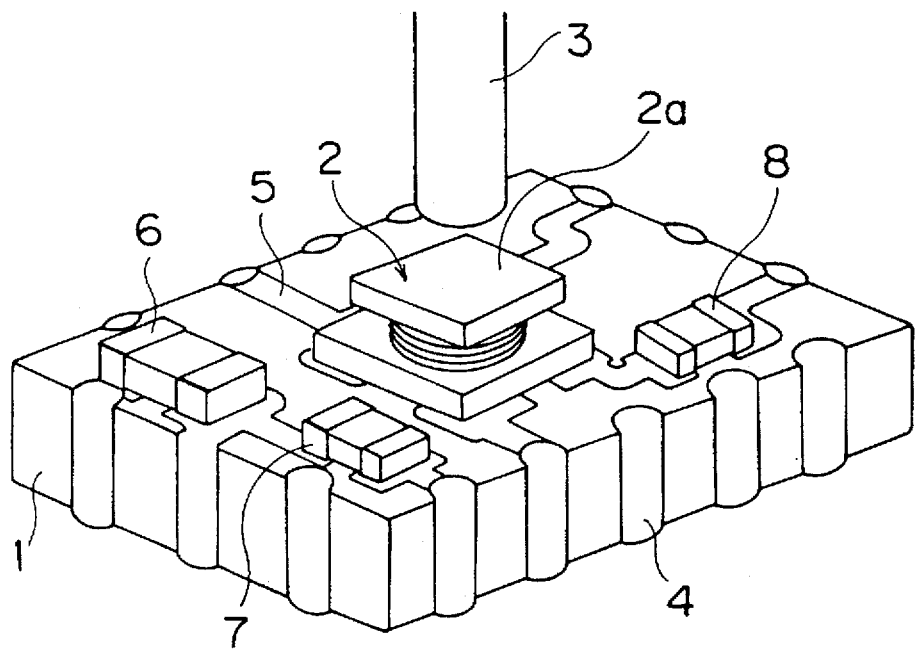
FIG. 1 is a perspective view showing an embodiment of the present invention.

FIG. 1 is a perspective view showing a chip-type electronic component according to an embodiment of the present invention. In the chip-type electronic component according to the embodiment shown in FIG. 1, an inductance 2 of a chip-type coil is mounted on a ceramic substrate 1 to be located substantially on its central portion. The chip inductance 2 has a flange portion 2a which is provided with a flat surface on its upper portion. This chip inductance 2 is soldered onto upper electrodes 5 which are formed on an upper surface of the ceramic substrate 1, to be fixed to the ceramic substrate 1.

In addition to the chip inductance 2, electronic component elements 6, 7 and 8 are mounted on the upper electrodes 5 of the ceramic substrate 1. The upper electrodes 5 are connected to side electrodes 4 which are provided on side surfaces of the ceramic substrate 1, so that the overall chip-type electronic component is surface-mounted on a circuit board and soldered at the portions of the side electrodes 4.

As shown in FIG. 1, the chip inductance 2 which is provided with the flange portion 2a having a flat surface is mounted substantially on the central portion of the ceramic substrate 1 in the chip-type electronic component according to this embodiment, whereby it is possible to hold the overall chip-type electronic component for surface-mounting the same by engaging the flat surface of the flange portion 2a of the chip inductance 2 with a suction nozzle 3.

Figure 2:
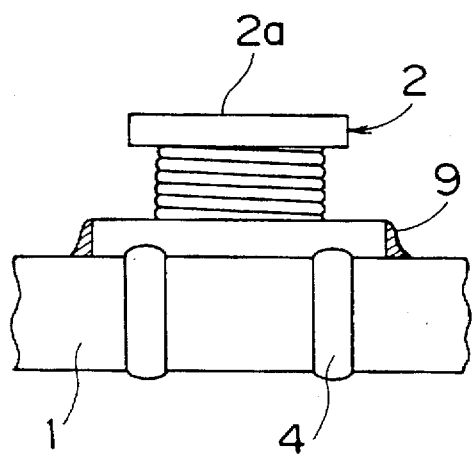
FIG. 2 is a front elevational view of the embodiment shown in FIG. 1.
Figure 3:
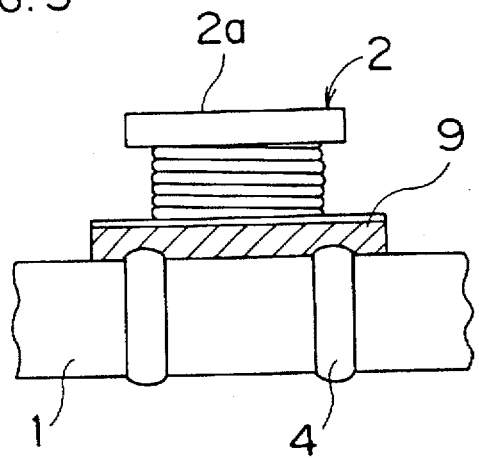
FIG. 3 is a side elevational view of the embodiment shown in FIG. 1.
Figure 4:
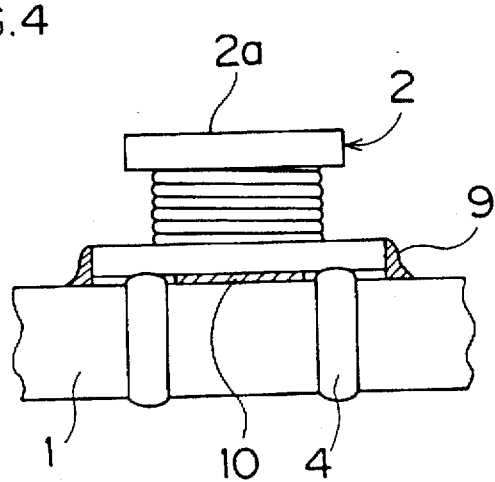
FIG. 4 is a front elevational view showing another embodiment of the present invention, in which a thermosetting resin member is provided between a chip inductance and a substrate for serving as an adhesive.

FIGS. 2 and 3 are a front elevational view and a side elevational view showing the chip inductance 2 which is mounted on the ceramic substrate 1 respectively. As shown in FIGS. 2 and 3, the chip inductance 2 is electrically connected with the electrodes provided on the ceramic substrate 1 by solder 9. While the chip inductance 2 is thus bonded to the ceramic substrate 1 through the solder 9, thermosetting resin 10 may be interposed between the chip inductance 2 and the substrate 1 to serve as an adhesive thereby improving bond strength between the same as shown in FIG. 4, if such bond strength is insufficient.

Figure 5:
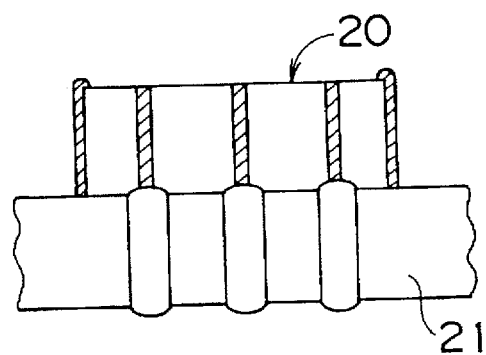
FIG. 5 is a front elevational view showing still another embodiment of the present invention, employing an inductance block as an electronic component element which is mounted on a substrate.

FIG. 5 shows an embodiment employing an inductance block as an electronic component element which is mounted on a substrate. Referring to FIG. 5, an inductance block 20 is provided on a ceramic substrate 21 of a dielectric member. As hereinabove described, the electronic component element which is mounted on a substrate is not restricted to such an inductance but may alternatively be prepared from a capacitor chip or an IC chip, for example.

After such an electronic component element is mounted on the substrate, the overall chip-type electronic component may be coated with silicon resin or the like, to be improved in reliability.

In the chip-type electronic component according to this embodiment, the electronic component element which is mounted on the substrate to be located substantially on its central portion is provided on its upper portion with a flat surface which can be engaged by a suction nozzle. When the chip-type electronic component according to the present invention is mounted on a printed circuit board or the like, therefore, it is possible to engage the flat surface provided on the upper portion of the electronic component element which is mounted substantially on the central portion of the substrate by a suction nozzle, thereby holding the overall chip-type electronic component for surface-mounting the same. Thus, there is no need to carry out casing or molding dissimilarly to the prior art and a space required for such casing or molding can be removed, whereby the inventive chip-type electronic component can be miniaturized as compared with the prior art.

Since no operation such as casing or molding is required, the inventive chip-type electronic component can be manufactured in simpler steps as compared with the prior art. Further, the inventive chip-type electronic component can be manufactured at a lower cost as compared with the prior art, since no material is required for casing or molding.

Figure 6:
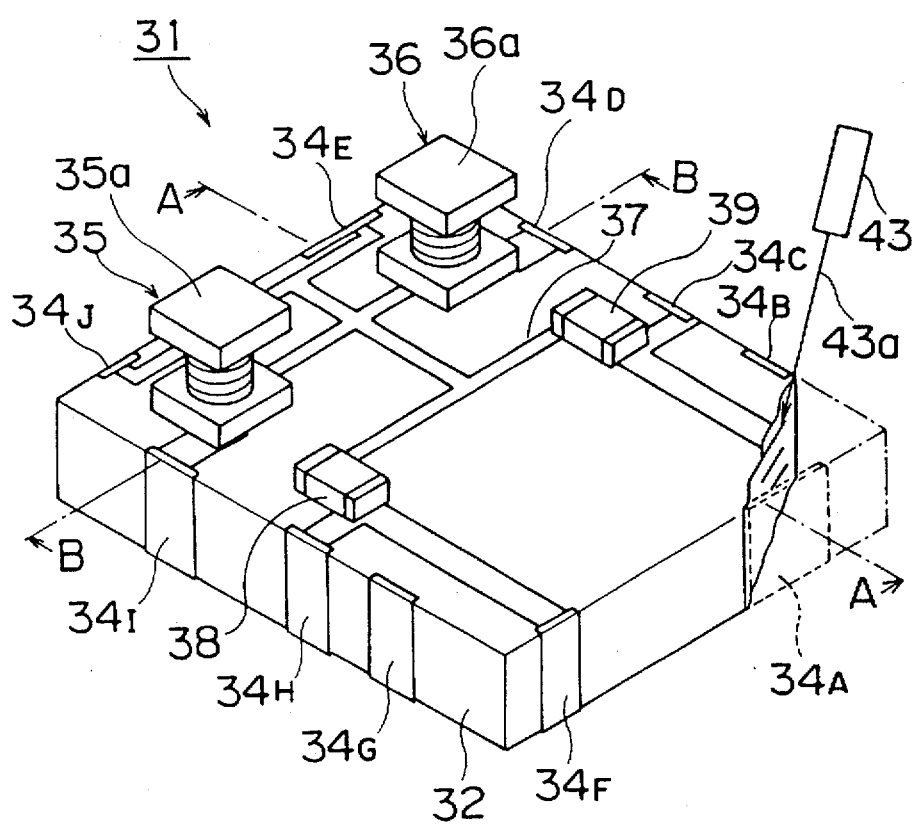
FIG. 6 is a perspective view showing a further embodiment according to the present invention.

FIG. 6 is a perspective view for illustrating a chip-type LC filter 31 according to a further embodiment of the present invention.

The LC filter 31 according to this embodiment is formed by a dielectric substrate 32 which is in the form of a rectangular plate. The dielectric substrate 32 is prepared by firing dielectric ceramics, for example, while a plurality of internal electrodes 33a to 33c are formed in this dielectric substrate 32, as sectionally shown in FIGS. 7A and 7B. The plurality of internal electrodes 33a to 33c are so arranged as to overlap with each other through a dielectric layer, thereby forming a single multilayer capacitor part. The internal electrodes 33a and 33c are drawn out on a side surface of the dielectric substrate 32, to be electrically connected with an electrode 34A which is formed on this side surface. On the other hand, the internal electrode 33b overlapping with the internal electrodes 33a and 33c is drawn out on another side surface of the dielectric substrate 52, to be electrically connected with a terminal electrode 54D which is formed on this side surface.

As hereinabove described, the dielectric substrate 32 is provided therein with a single capacitor part according to this embodiment, whereby it is possible to reduce the number of multilayer capacitors to be mounted on the upper or lower surface of the dielectric substrate 32, thereby enabling miniaturization of the overall LC filter 31.

Figure 8:
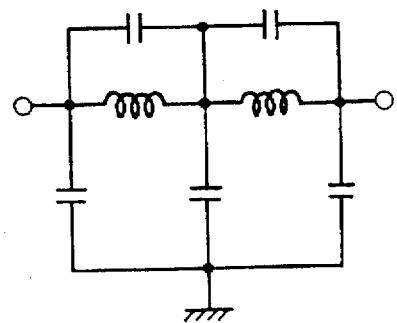
FIG. 8 is a circuit diagram showing a circuit which is formed in an LC filter according to the embodiment shown in FIG. 6.

Referring again to FIG. 6, a plurality of chip-type coils 35 and 36 are mounted on the upper surface of the dielectric substrate 32. Further, an interconnection pattern 37 is formed on the upper surface of the dielectric substrate 32 by applying conductive paste and baking the same. In addition, multilayer capacitors 38 and 39 are fixed onto the upper surface of the dielectric substrate 32. The chip-type coils 35 and 36 and the multilayer capacitors 38 and 39 are electrically connected with each other by the aforementioned interconnection pattern 37. On the other hand, electrodes 34A to 34J are formed on the side surfaces of the dielectric substrate 32, to be electrically connected to the interconnection pattern 37 and the internal electrodes 33a to 33c which are provided in the dielectric substrate 32 respectively. These elements are electrically connected to be capable of forming an LC filter which is shown in FIG. 8 in a circuit diagram.

Figure 7A:
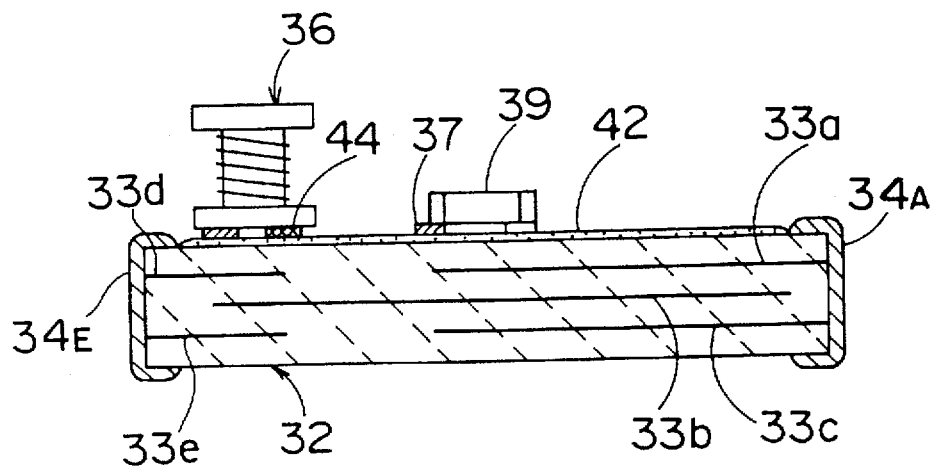
FIG. 7A is a sectional view taken along the line A—A in FIG. 6.
Figure 7B:
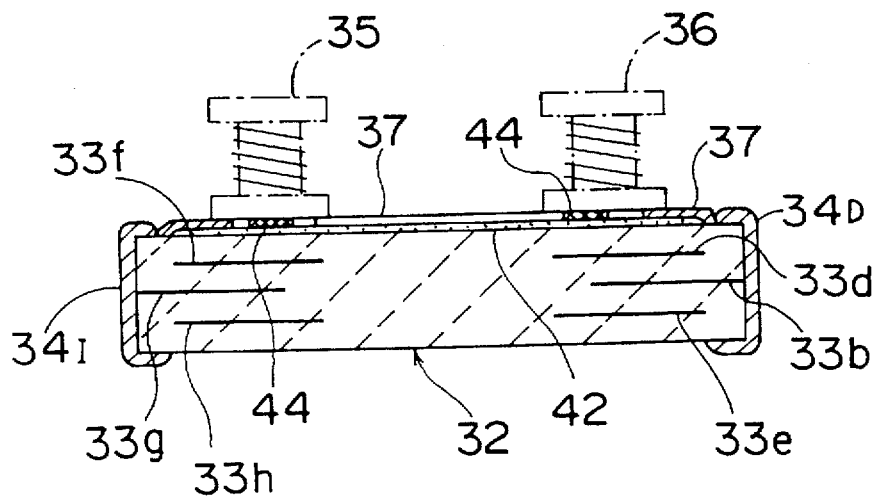
FIG. 7B is a sectional view taken along the line B—B in FIG. 6.

Referring to FIGS. 7A and 7B, a glass glaze layer 42 is adapted to reduce floating capacitance between the internal electrode 33a which is provided in the dielectric substrate 32 and the interconnection pattern 37 which is provided on its upper surface.

It is possible to surface-mount the LC filter 31 according to this embodiment through some of the electrodes 34A to 34J provided on the side surfaces of the dielectric substrate 32, which are necessary for connecting this LC filter 31 with the exterior, on a printed circuit substrate or the like. In other words, the LC filter 31 according to this embodiment is structured as a surface-mounted chip-type LC filter. Thus, it is possible to efficiently mount this LC filter 31 on a printed circuit board or the like with an automatic machine.

Due to the aforementioned capacitor part which is formed in the dielectric substrate 32, it is possible to reduce the number of separate capacitors, thereby miniaturizing the overall LC filter 31 by the capacitor part contained therein.

Further, it is possible to adjust the characteristics by applying a laser beam 43a from a laser unit 43 which is provided in the exterior, thereby trimming the internal electrode 33a forming the capacitor part, as shown in FIG. 6 in a partially fragmented manner. In other words, it is possible to adjust the characteristics of the overall LC filter 31 by reducing the area of the internal electrode 33a by such laser trimming, thereby adjusting capacitance of the capacitor part. This adjustment can be finely mounted out in high accuracy, due to application of the laser beam 43a, while the adjusted value substantially remains unchanged. Thus, the characteristics are improved in stability after such adjustment.

According to this embodiment, the chip-type coils 35 and 36 are employed as inductance components which are mounted on the upper surface of the dielectric substrate 52. Therefore, it is also possible to trim upper flange portions 55a and 36a of the chip-type coils 35 and 56 by irradiating the same with laser beams, thereby adjusting the characteristics. In the LC filter 31 according to this embodiment, therefore, the characteristics can be easily adjusted not only in the capacitor part but in the inductance components, whereby it is possible to further easily adjust the overall characteristics in high accuracy.

While the chip-type coils 35 and 56 are provided on positions which are separated from the center of the dielectric substrate 32 according to this embodiment, it is possible to engage the upper flange portions 35a and 56a of these chip-type coils 35 and 36 with high-power suction nozzles, for holding and surface-mounting the LC filter 31.

Figure 9:
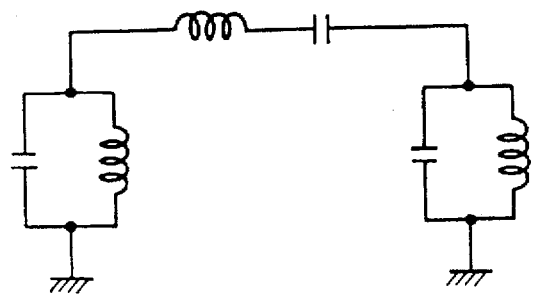
FIG. 9 is a circuit diagram showing an exemplary circuit of an LC filter to which the present invention is applied.
Figure 10:
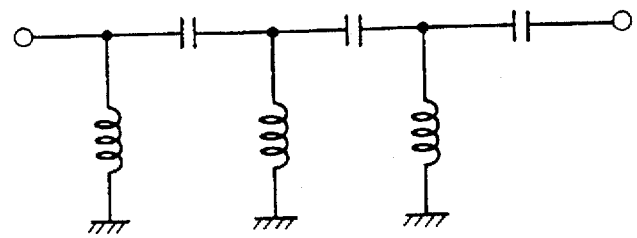
FIG. 10 is a circuit diagram showing another exemplary circuit of an LC filter to which the present invention is applied.
Figure 11:
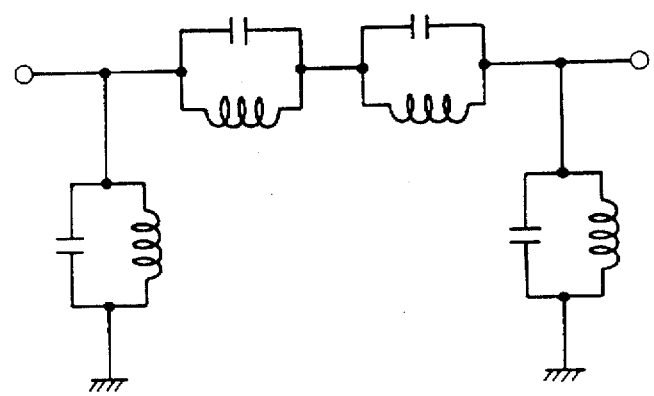
FIG. 11 is a circuit diagram showing still another exemplary circuit of an LC filter to which the present invention is applied.

While the two chip-type coils 35 and 36 serving as inductance components, the single capacitor part which are provided in the dielectric substrate 52 and the two capacitors 38 and 39 form the LC filter shown in FIG. 8 in the aforementioned embodiment, the present invention is not restricted to the LC filter having the circuit shown in FIG. 8 but is also applicable to LC filters having various circuit structures shown in FIGS. 9 to 11, for example. Namely, it is possible to provide a miniature chip-type LC filter whose characteristics can be easily adjusted in high accuracy similarly to the aforementioned embodiment, by forming at least one capacitor part in a dielectric substrate and mounting at least one inductance component and a necessary capacitor component on the upper surface of this dielectric substrate.

Further, another element such as a resistor, for example, may be mounted on the dielectric substrate 32, or a resistor film may be formed on the dielectric substrate 52, to form a chip-type LC filter.

Referring again to FIGS. 7A and 7B, the chip-type coil 35 is fixed onto the dielectric substrate 52 through a thermosetting adhesive 44, which is so provided that the chip-type coil 35 will not fall from the dielectric substrate 32 by heat when the LC filter 31 is passed through a fellow furnace to be mounted on a printed circuit board or the like. While an electrode which is provided on the lower surface of the chip-type coil 55 may be bonded to the interconnection pattern 37 in order to complete the LC filter 31 as simple a component, the chip-type coil 35 is fixed to the dielectric substrate 32 through the thermosetting adhesive 44 to be prevented from falling caused by heat which is applied in employment. When the LC filter 31 is not subjected to such heat in employment, therefore, the thermosetting adhesive 44 may be omitted.

According to this embodiment, it is possible to reduce the number of separate capacitors which are required for forming an LC filter, since at least one capacitor part is formed in the dielectric substrate. Thus, the overall LC filter can be miniaturized.

Further, the LC filter 31, which is electrically connected with the exterior through a terminal electrode provided on a side surface or the lower surface of the dielectric substrate 52, can be surface-mounted on a printed circuit board or the like. In addition, it is possible to adjust the characteristics in the aforementioned capacitor part by laser trimming, whereby fine adjustment of the characteristics is facilitated and the characteristics are improved in stability after the adjustment. Thus, the LC filter is improved in reliability with reduction in number of required elements.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method for mounting a surface mounted chip-type LC filter on a circuit board, the method comprising the steps of:

providing a dielectric substrate;

forming an upper electrode on an upper surface of said dielectric substrate;

mounting a plurality of electronic component elements on said dielectric substrate and soldering said electronic component elements to said upper electrode, and providing at least one of said electronic component elements with a flat upper surface;

said at least one electronic component comprising a chip-type coil having upper and lower flange portions, said upper flange portion having said flat upper surface, said chip-type coil being mounted substantially at a central portion of said dielectric substrate and others of said plurality of electronic component elements being arranged around said chip-type coil;

said flat upper surface being adapted to be engaged by a suction nozzle thereby allowing holding of said chip-type electronic component for mounting on the circuit board;

preparing a capacitor part by forming a plurality of internal electrodes in said dielectric substrate which overlap with each other through a dielectric layer;

providing a side electrode on a side surface of said dielectric substrate and connected to said capacitor part and said upper electrode; and lifting said entire chip-type LC filter, including said substrate, said upper electrode, and said plurality of electronic component elements soldered thereto, by engaging only said flat upper surface with a suction nozzle, and then placing said chip-type LC filter on a circuit board for being mounted thereon.

2. A method as in claim 1, further comprising the step of adjusting capacitance of said capacitor part by trimming off a portion of said dielectric substrate with a laser.

* * * * *